United States Patent
Holcomb

[19]

[11] Patent Number: 5,998,336
[45] Date of Patent: Dec. 7, 1999

[54] CERAMIC/METAL AND A15/METAL SUPERCONDUCTING COMPOSITE MATERIALS EXPLOITING THE SUPERCONDUCTING PROXIMITY EFFECT AND METHOD OF MAKING THE SAME

[75] Inventor: Matthew J. Holcomb, Manhattan Beach, Calif.

[73] Assignee: The Board of Trustees of the Leland Stanford Junior University, Palo Alto, Calif.

[21] Appl. No.: 08/806,697

[22] Filed: Feb. 26, 1997

[51] Int. Cl.$^6$ .............................. H01L 39/00; H01B 12/00
[52] U.S. Cl. ....................... 505/124; 505/236; 505/470; 505/490; 505/500; 29/599; 252/514; 252/518.1; 428/403; 428/404; 428/457; 428/697; 428/699; 428/702; 428/555; 428/558; 428/930; 174/125.1
[58] Field of Search .................................. 505/124, 230, 505/236, 237, 450, 470, 490, 500, 806; 428/403, 404, 457, 689, 697, 699, 701, 702, 930, 553, 555, 558; 29/599; 174/125.1; 252/514, 518.1

[56] References Cited

U.S. PATENT DOCUMENTS

| | | | |
|---|---|---|---|
| 3,380,935 | 4/1968 | Ring .......................................... | 252/512 |
| 4,050,147 | 9/1977 | Winter et al. .............................. | 29/599 |
| 4,108,737 | 8/1978 | Ehrhardt et al. ........................... | 204/13 |
| 4,971,944 | 11/1990 | Charles et al. ............................... | 505/1 |
| 5,041,416 | 8/1991 | Wilson ........................................ | 505/1 |
| 5,081,072 | 1/1992 | Hosokawa et al. .......................... | 505/1 |
| 5,091,362 | 2/1992 | Ferrando .................................... | 505/1 |
| 5,132,278 | 7/1992 | Stevens et al. .............................. | 505/1 |
| 5,194,420 | 3/1993 | Akihama ..................................... | 505/1 |
| 5,202,307 | 4/1993 | Hayashi ...................................... | 505/1 |
| 5,226,947 | 7/1993 | Jablonski et al. .......................... | 75/245 |
| 5,374,320 | 12/1994 | Matsumoto et al. ..................... | 148/421 |
| 5,489,573 | 2/1996 | DeLuca et al. ........................... | 505/238 |
| 5,501,746 | 3/1996 | Egawa et al. ............................. | 148/98 |
| 5,547,924 | 8/1996 | Ito et al. ................................... | 505/500 |

*Primary Examiner*—Marie Yamnitzky
*Attorney, Agent, or Firm*—Lumen Intellectual Property Services

[57] ABSTRACT

A composite superconducting material made of coated particles of ceramic superconducting material and a metal matrix material. The metal matrix material fills the regions between the coated particles. The coating material is a material that is chemically nonreactive with the ceramic. Preferably, it is silver. The coating serves to chemically insulate the ceramic from the metal matrix material. The metal matrix material is a metal that is susceptible to the superconducting proximity effect. Preferably, it is a NbTi alloy. The metal matrix material is induced to become superconducting by the superconducting proximity effect when the temperature of the material goes below the critical temperature of the ceramic. The material has the improved mechanical properties of the metal matrix material. Preferably, the material consists of approximately 10% NbTi, 90% coated ceramic particles (by volume). Certain aspects of the material and method will depend upon the particular ceramic superconductor employed. An alternative embodiment of the invention utilizes A15 compound superconducting particles in a metal matrix material which is preferably a NbTi alloy.

22 Claims, 3 Drawing Sheets

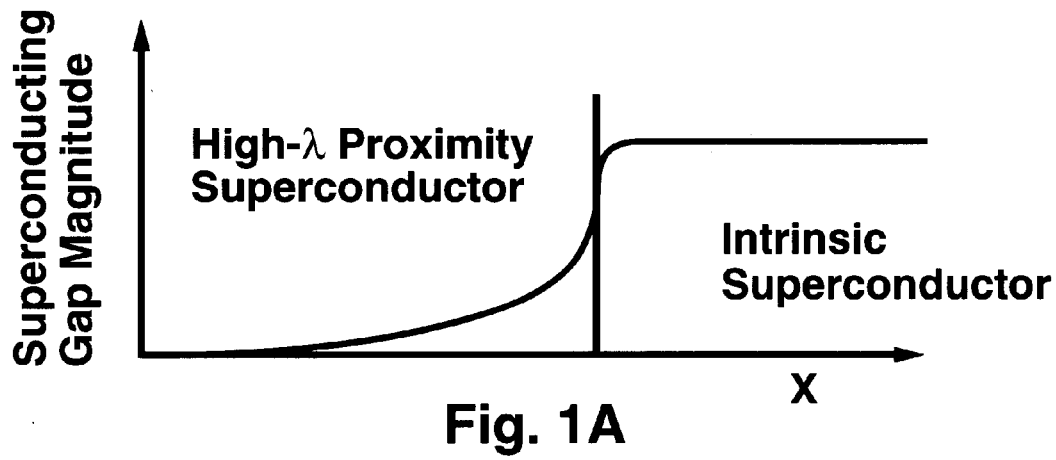
Fig. 1A
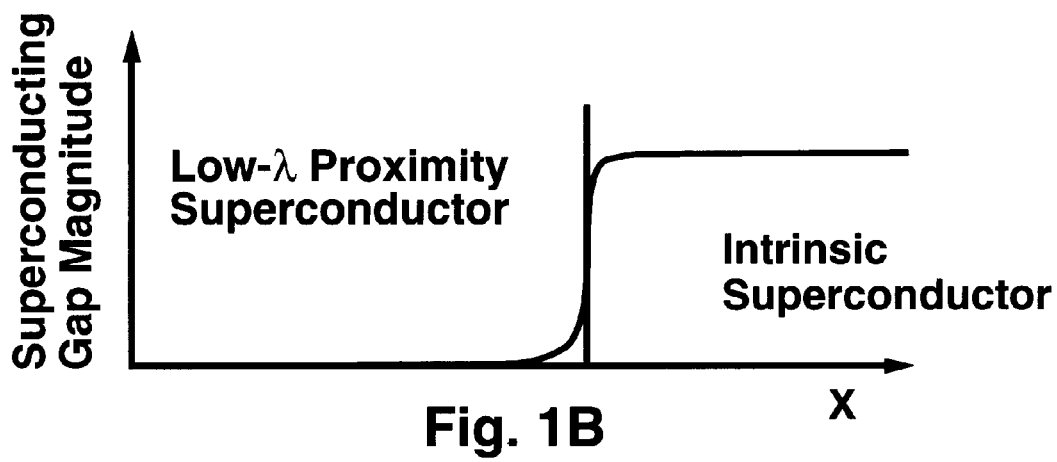
Fig. 1B
Fig. 2
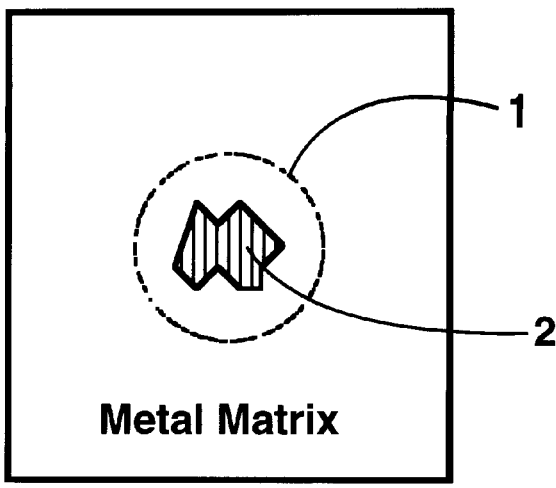

Fig. 3
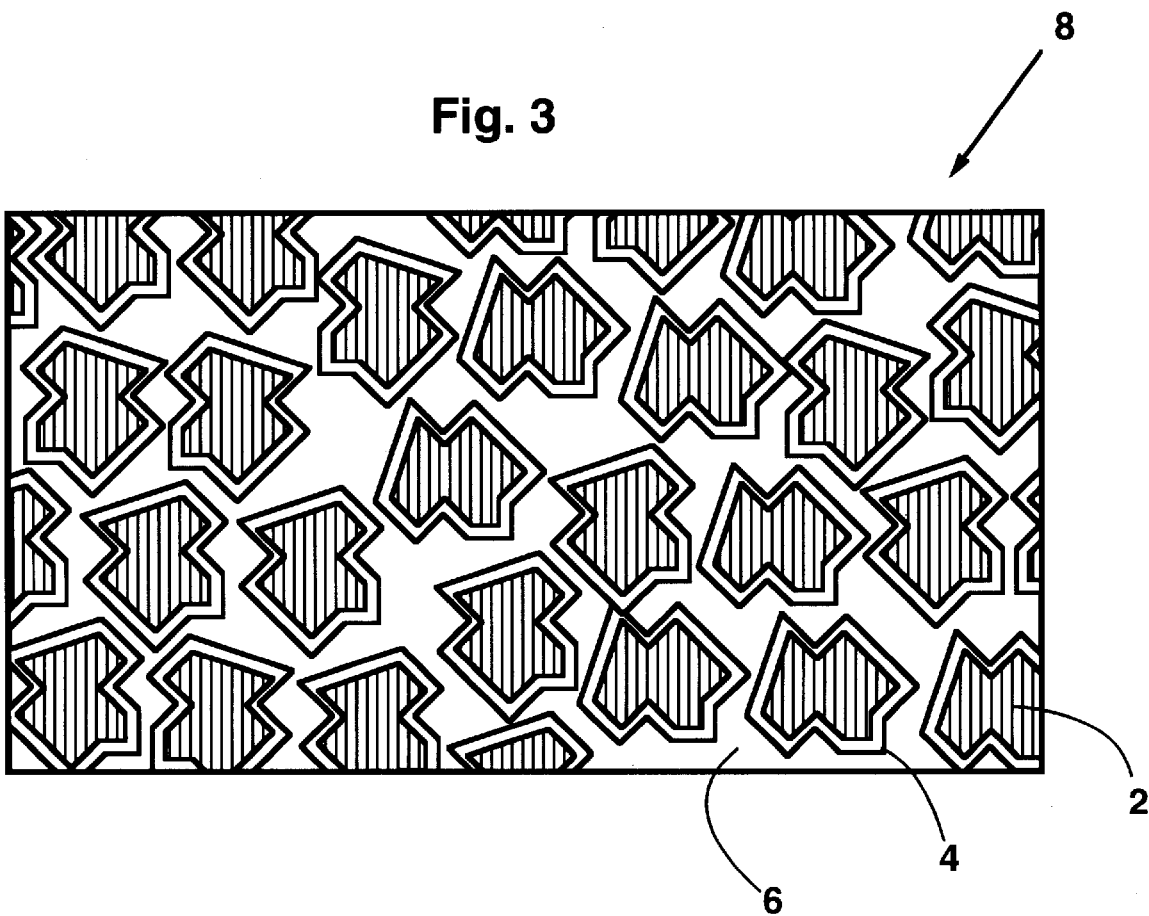
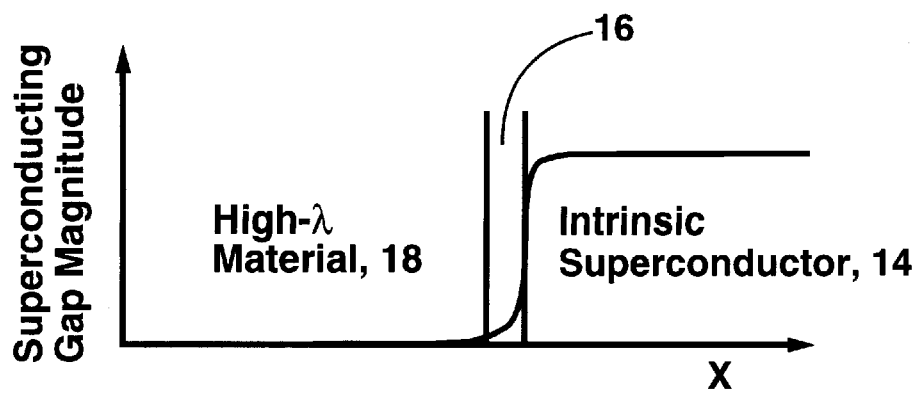
Fig. 4A

CERAMIC/METAL AND A15/METAL SUPERCONDUCTING COMPOSITE MATERIALS EXPLOITING THE SUPERCONDUCTING PROXIMITY EFFECT AND METHOD OF MAKING THE SAME

The development of this invention was supported in part by grant number DEFG03-86ER45245-A012 from the U.S. Department of Energy. The United States Government has certain rights to the invention.

FIELD OF THE INVENTION

This invention relates to high temperature ceramic superconductors and A15 superconductors and, more specifically, to improving the superconducting and mechanical characteristics of these superconducting materials.

BACKGROUND OF THE INVENTION

The discovery of high critical temperature ($T_c$) ceramic superconductors has inspired an enormous interest in their application. Conventional niobium alloy superconductors such as NbTi must be cooled well below 10 K to achieve useful superconductivity. High $T_c$ superconductors, on the other hand, have $T_c$s over 100 K. Due to the great expense of cryogenic refrigeration, the high $T_c$ materials could find much wider application in electronic and laboratory devices. Of particular interest are materials which have $T_c$ above 77 K, because this is the temperature of liquid nitrogen, a common and relatively inexpensive refrigerant.

Ceramic superconducting materials have not been used in many potential applications because they suffer from a number of shortcomings. The most severe problems with the ceramic superconductors are as follows:

1) They are brittle. They are not flexible and thus cannot be made into wires or other useful shapes. Cracks and boundaries between adjacent crystals severely limit supercurrent flow.

2) They are highly anisotropic. Supercurrents preferentially flow in certain directions with respect to the crystal lattice, reducing maximum supercurrent flow in randomly oriented multicrystalline pieces.

3) They are strong oxidizing agents. Many metals, such as copper, lead, tin, and niobium, are oxidized by contact with the ceramic superconductors, forming an insulating layer which impedes supercurrent flow. Only noble metals such as gold, silver, palladium and their alloys resist being oxidized by the ceramic superconductors.

A less severe undesirable feature of the high temperature ceramic superconductors is that they can lose their superconducting properties. The superconducting structure inside the ceramics has an abundance of oxygen atoms which are necessary for superconductivity. Heating, grinding, etching, or prolonged exposure to ambient atmosphere or vacuum liberates the oxygen and destroys superconductivity. Oxygen content can be restored by annealing the ceramic in an atmosphere with a partial pressure of oxygen.

The A15 superconductors such as $Nb_3Sn$ are also brittle materials (although they are not anisotropic and relatively nonreactive). Their poor mechanical properties has precluded their use in many applications requiring ductility such as wires. This is unfortunate because they generally have superior superconducting properties such as high $T_c$s and high critical magnetic fields.

To overcome the brittleness and anisotropy of the high $T_c$ ceramics, the superconducting proximity effect has been exploited in a number of prior art inventions.

THE SUPERCONDUCTING PROXIMITY EFFECT

The superconducting proximity effect occurs at the boundary between a normal conductor (a metal) and an intrinsic superconductor. The intrinsic superconductor induces the normal conductor to become superconducting near the boundary. The proximity superconductor has all the properties of a true superconductor. It expels magnetic fields, has a critical current density, and a superconducting gap. Also, the proximity superconductor is isotropic, and thus, is able to conduct supercurrent in any direction.

The superconducting gap is an absence of electron energy states near the Fermi energy in a superconductor. It arises from the pairing of the electrons in the material which occurs at the superconducting critical temperature. The magnitude of the critical current density in any superconducting material is proportional to the superconducting gap. Thus, the larger the superconducting gap, the larger will be the critical current density of the material.

Since the proximity effect has an exponential decay characteristic, it is possible to specify a decay length. The decay length is the length over which the superconducting gap (and therefore the critical current density) of the proximity superconductor decreases by 1/e. The decay length is determined by the proximity superconductor and the temperature, to which it is inversely proportional. Silver, for example, has decay lengths of 22 nm and 44 nm at 77 K and 38.5 K, respectively. The properties of the intrinsic superconductor are immaterial to the decay length. Decay lengths for a number of different metals are given in Table 1

TABLE 1

| Metal | Decay Length at 77K |
| --- | --- |
| Lead | 29 nanometers |
| Tin | 30 nanometers |
| NbTi | 22 nanometers |
| Niobium (Nb) | 22 nanometers |
| Mercury | 25 nanometers |
| Silver | 22 nanometers |
| Gold | 22 nanometers |
| Copper | 25 nanometers |

A property of a proximity superconductor that is essential for understanding the proximity effect is the electron-phonon coupling coefficient, $\lambda$. While the decay length affects how rapidly (with distance) the superconducting gap decreases, $\lambda$ affects the magnitude of the superconducting gap of the proximity superconductor. The $\lambda$ values for a number of different metals are given in Table 2

TABLE 2

| Metal | Electron-Phonon Coupling, $\lambda$ |
| --- | --- |
| Lead | 1.55 |
| Tin | 0.72 |
| NbTi | 0.92 |
| Niobium (Nb) | 1.22 |
| Mercury | 1.00 |
| Silver | 0.14 |
| Gold | 0.14 |
| Copper | 0.08 |
| Lead/Bismuth Alloys | 2–3 |

The value of $\lambda$ is a fundamental property of the electronic structure of a metal. Due to the nature of electron-phonon coupling, metals with a high value of $\lambda$ (i.e., $\lambda=1$ to 2, such as lead, lead/bismuth alloys, tin, and NbTi alloys) generally have high resistivities and higher superconducting critical temperatures. Metals with low values for $\lambda$ (i.e., $\lambda$=0.1 to 0.2, such as silver and gold) generally have low resistivities and lower or no critical temperatures. Experimentally, it is observed that high $\lambda$ metals are more easily oxidized than low $\lambda$ metals.

All other factors being equal, high-$\lambda$ proximity superconductors always have a larger superconducting gap, and therefore a larger critical current density, than low-$\lambda$ proximity superconductors. It is noted that $\lambda$=0 for insulators.

FIGS. 1A and 1B show the magnitudes of the superconducting gap for a high-$\lambda$ proximity superconductor and a low-$\lambda$ proximity superconductor, respectively. The high-$\lambda$ proximity superconductor has a larger superconducting gap. Both curves are proportional to $e^{-kx}$, where k is the decay length and x is the perpendicular distance from the boundary.

Large supercurrents can be carried in proximity superconductors with long decay lengths and large $\lambda$ values. Since the decay length is inversely proportional to temperature, low temperatures enhance the proximity effect.

It is noted that the critical current density is an important characteristic of superconducting materials because it is the maximum current density the material can carry. Many applications such as magnets demand high supercurrent density. It is desirable for superconducting materials to have as high a critical current density as possible.

The supercurrent transport in a normal conductor induced superconducting by the proximity effect is fundamentally different from supercurrent flowing through a Josephson junction because the normal conductor truly becomes superconducting. In a Josephson junction, the supercurrent is tunneling through the insulating or normal conductor barrier that comprises the junction. The supercurrent in a Josephson junction can only pass from intrinsic superconductor to intrinsic superconductor. In a proximity superconductor, a supercurrent can travel within the regions induced superconducting. The supercurrent can travel parallel to the boundary, for example.

The proximity effect is particularly well suited for adapting the ceramic superconductors for use as shaped conductors requiring ductility. Consider a superconducting ceramic chip 2 embedded in matrix of metal as shown in FIG. 2. The chip 2 will induce the surrounding metal to become superconducting. The circle 1 represents the distance that the proximity effect extends into the metal matrix. If enough chips 2 are dispersed throughout the metal, then neighboring chips will be close enough to be coupled by the induced superconductivity. A supercurrent will be able to travel through the material by staying within the regions induced superconducting. Perhaps the greatest benefit of this scheme is that the metal matrix will become superconducting at the $T_c$ of the ceramic chips 2 which can be over 100 K. The anisotropy problem with ceramic superconductors is eliminated because the induced superconductor is isotropic. Further, since the chips 2 are surrounded by metal, the material as a whole acquires the improved ductility of the metal.

PRIOR ART

U.S. Pat. No. 5,041,416 to Wilson describes a method for making a composite superconducting material. Powders of ceramic superconductor and normal metal are mixed and the mixture is subjected to heat and high pressure. The temperature is controlled during the process such that excessive oxygen is not lost from the ceramic. The result is a relatively ductile material which can be shaped and has a critical temperature of the ceramic. Any metal can be used, but silver is preferred because it is not oxidized by the ceramic. A severe problem with this invention is that it relies on silver or other noble materials as a proximity superconductor. Noble metals have the disadvantage of being low $\lambda$ materials. This greatly reduces the superconducting gap of the proximity superconductor, and, hence the maximum supercurrent the material can carry. If non-noble, higher $\lambda$ metals are used and an oxide layer is formed at the interface, then the oxide layer will block the proximity effect. Also, oxide layers will allow the penetration of modest magnetic fields, which interfere with supercurrent flow. Another problem with this invention is that when ceramic and silver powders are mixed, the silver particles tend to clump together, forming a macroscopically inhomogeneous material. For a composite material to exploit the proximity effect properly, the constituent powders must be evenly distributed.

U.S. Pat. No. 5,194,420 to Akihama describes a composite ceramic/metal superconducting material consisting of superconducting ceramic particles dispersed in a metal matrix material. This material also exploits the proximity effect. Many different metals are disclosed for use as the normal metal matrix. These metals have the same problems discussed above. The noble metals have a low value of $\lambda$, and the non-noble metals are oxidized by the ceramic, forming a supercurrent inhibiting oxide layer. Also, as discussed above, metal particles, when mixed with bare ceramic particles, do not form a homogeneous mixture, but tend to form clumps.

U.S. Pat. No. 5,081,072 to Hosokawa et al. describes a method of preparing a superconducting ceramic powder and forming the powder into a superconducting material. The invention is primarily concerned with the operation of the milling/mixing machine that produces the ceramic powder. Also discussed is the possibility of coating the particles with silver or gold. A coating will chemically protect the ceramic particles. The patent correctly states that the proximity effect will induce the silver or gold to become superconducting. A composite material made only with silver or gold coated ceramic particles will have all the disadvantages associated with low $\lambda$ proximity superconductors, however. The maximum supercurrent carrying capability of the resultant material will be relatively low. Further, because the silver or gold can only be made to be weakly superconducting, the material will behave poorly in modest magnetic fields. This is because the presence of the magnetic field in the weakly superconducting low-$\lambda$ metal disrupts the supercurrent transport between the ceramic particles.

Therefore, there exists a need for a composite superconducting material that has mechanical properties superior to bulk ceramic materials, does not experience problems associated with the chemical reactivity of the ceramic superconductors, has a high critical temperature, and is designed to have a high supercurrent carrying capability.

OBJECTS AND ADVANTAGES OF THE INVENTION

It is an object of the present invention to provide a composite superconducting material that:

1) has a relatively high critical temperature, 2) has improved mechanical properties (such as ductility) compared to ceramic superconductors, 3) chemically isolates the ceramic superconducting material from the proximity superconducting material, 4) has increased isotropy compared to bulk ceramic superconductors, 5) has increased critical current density compared to the prior art composite superconducting materials, and 7) has increased ability to remain superconducting in applied magnetic fields compared to the prior art.

It is a further object of this invention to provide an A15 superconducting material that:

1) has improved mechanical properties compared to pure A15 materials, and 2) retains the superior superconducting properties (relatively high $T_c$, and high critical magnetic field) of the A15 materials.

SUMMARY OF THE INVENTION

The present invention discloses a composite superconducting material and method for making the material. The material consists of particles of superconducting ceramic coated with a thin layer of noble material (preferably silver) and a metallic matrix material (preferably a NbTi alloy) disposed between the coated ceramic particles. The dimensions of the ceramic particles are larger than the coherence length of superconducting electrons in the ceramic. The coating material is selected such that it is not oxidized by contact with the ceramic particles. The coating functions to chemically isolate the metal matrix material from the ceramic. The coating is further selected such that it is relatively permeable to oxygen. The coating is thin compared to the decay length of the coating material at the temperature the composite material is to be used.

Surrounding and completely filling the regions between the coated ceramic particles is the metal matrix material. The metal matrix material is selected to be susceptible to the superconducting proximity effect. Thus, the metal matrix material preferably has a long decay length and a high electron-phonon coupling coefficient, $\lambda$. When the composite material is cooled below the critical temperature of the ceramic particles, the proximity effect induces the metal matrix material to become superconducting. Preferably, the metal matrix material is a NbTi alloy, but may be any proximity superconductor.

The composite material is made by first producing a powdered superconducting ceramic. Preferably, the powdered ceramic has particles of consistent size. Before coating the particles, they are cleaned to remove any insulating contaminants. Cleaning can be accomplished by plasma etching. The preferred coating material, silver, can be applied to the particles with chemical or physical coating techniques. After the particles are coated, the oxygen content of the interior ceramic is restored. This is done by annealing the coated particles at elevated temperature in an atmosphere with a partial pressure of oxygen.

To form the composite, powders of the metal matrix material and the coated ceramic are mixed thoroughly and bonded. The mixture may be disposed inside a metal tube and drawn or disposed in a mold and compressed. Such powder metallurgical techniques are well known in the art.

An alternative embodiment of this invention is a composite material made of a metal matrix material (preferably a NbTi alloy) and an A15 material such as $Nb_3Sn$. The A15 material is in particulate form and the metal matrix material surrounds the A15 particles. In this embodiment, the A15 particles induce the metal matrix material to become superconducting via the proximity effect. No special coatings are necessary because A15 compounds are not particularly reactive with respect to the NbTi metal matrix material.

DESCRIPTION OF THE FIGURES

FIG. 1A is a graph of the superconducting gap magnitude in a relatively high $\lambda$ proximity superconductor.

FIG. 1B is a graph of the superconducting gap magnitude in a relatively low $\lambda$ proximity superconductor.

FIG. 2 is a cross sectional view of a single superconducting ceramic chip in a metal matrix material.

FIG. 3 is a cross sectional view of the high $T_c$ ceramic embodiment of the composite superconducting material of the present invention.

FIG. 4A is a graph of the conventional understanding of the superconducting gap in a three layer junction with a low-$\lambda$ metal in the middle.

DETAILED DESCRIPTION

Figure 4B:
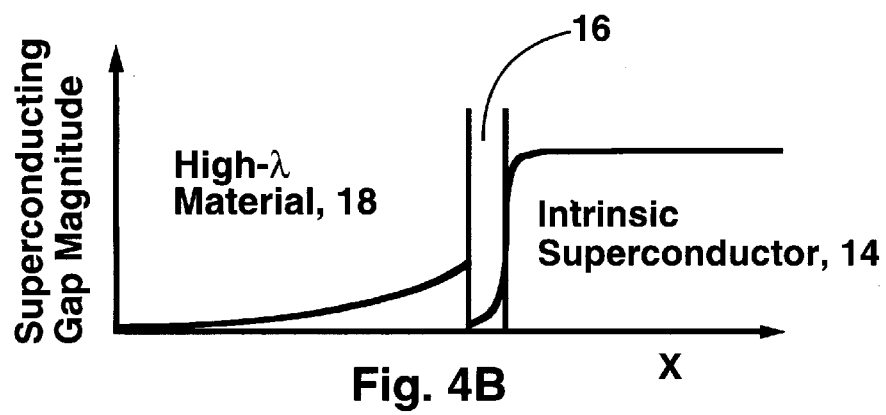
FIG. 4B is a graph of the new understanding of the superconducting gap in a three layer junction with a low-$\lambda$ metal in the middle.

This invention exploits the proximity effect to provide a composite superconducting material.

A magnified cross sectional view of a ceramic composite superconducting material 8 according to this invention is shown in FIG. 3. The composite material consists of superconducting high $T_c$ ceramic particles 2, coated with a thin layer of noble material 4 and surrounded by a metallic matrix material 6. Although the ceramic particles 2 are hard and brittle, the composite material 8 is relatively ductile because the metallic matrix material 6 is ductile. The composite material 8 may be placed in a silver or copper tube and drawn to form a relatively flexible wire.

The ceramic particles 2 have physical dimensions larger than the superconducting coherence length of the ceramic. Typically, the coherence length of high $T_c$ ceramic materials is 1.5 nm. Preferably, the ceramic particles 2 are uniform in size and are in the range of 0.5 to 1.0 microns. The ceramic particles 2 may be single crystals or multicrystalline.

The noble material 4 is selected such that it is chemically nonreactive with the superconducting ceramic particles 2. The superconducting ceramics are strong oxidizing agents and will oxidize all but the most noble metals such as silver, gold, and their alloys. If an oxidizable metal is contacted to the ceramic particles 2, an insulating metal oxide layer will form which blocks the superconducting proximity effect. For this and other reasons such as cost, silver is the preferred noble material.

The noble material coating 4 should be much thinner than the proximity effect decay length of the noble material. Also, the noble material coating 4 must be thick enough to chemically isolate the ceramic particles 2 from the metallic matrix material 6. For silver, a coating thickness of 5 nm is acceptable as the proximity effect decay length in silver is 22 nm (at 77 K).

Both the noble material/ceramic and noble material/metal matrix material interfaces must be clean and free of insulating contaminants. Insulating contaminants will block the superconducting proximity effect.

The metal matrix material 6 is selected to have a large electron-phonon coupling coefficient, $\lambda$, and a long superconducting decay length. A large value of $\lambda$ means that it is highly susceptible to the superconducting proximity effect. The combination of a long decay length and large electron-phonon coupling coefficient results in a large proximity effect extending deep into the metal matrix material 6. This is preferable as it increases the critical current density and improves the mechanical properties of the composite material 8 by allowing for greater distances between adjacent ceramic particles 2. The metal matrix material 6 should also be ductile to impart ductility to the composite material 8.

Since the metal matrix material 6 is induced superconducting by the ceramic particles 2, the temperature at which the matrix material 6 becomes superconducting is the $T_c$ of the ceramic particles 2. Thus, the composite material 8 has a $T_c$ equal to the $T_c$ of the ceramic particles 2. Several ceramic superconductors and their $T_c$s are shown in Table 3.

The composite material 8 as a whole is superconducting because the superconducting proximity effect penetrates through the noble material coating 4 into the surrounding metal matrix material 6. The proximity effect can penetrate the noble material coating 4 because the noble material coating 4 is substantially thinner than the decay length of the noble material. This is significant because, prior to the development of this invention, conventional superconductor theory held that the superconducting proximity effect could not extend beyond a layer of a low-$\lambda$ metal. This is illustrated in FIG. 4A which shows a cross sectional view of the superconducting gap magnitude as it was believed to exist in a three layer junction. The junction comprises an intrinsic superconductor 14, a thin layer of low-$\lambda$ material 16, and a high-$\lambda$ material 18. The gap clearly drops to nearly zero in the low-$\lambda$ material 16 and stays at nearly zero in the high-$\lambda$ material 18. Thus, the high-$\lambda$ material 18 is not superconducting. What actually happens in the three layer junction is shown in FIG. 4B. The superconducting gap rebounds in the high-$\lambda$ material 18, provided that the low-$\lambda$ layer 16 is thin compared to the decay length of the low-$\lambda$ material. Thus, making a superconducting composite material 8 is possible even if the intrinsic superconductor is surrounded by a layer of low-$\lambda$ material 16.

It is noted that the low-$\lambda$ (noble material) coating 4 is somewhat detrimental to the superconducting properties of the composite material 8. It is best to make the coating 4 as thin as possible, while still providing chemical isolation for the interior ceramic particles 2.

Figure 5:
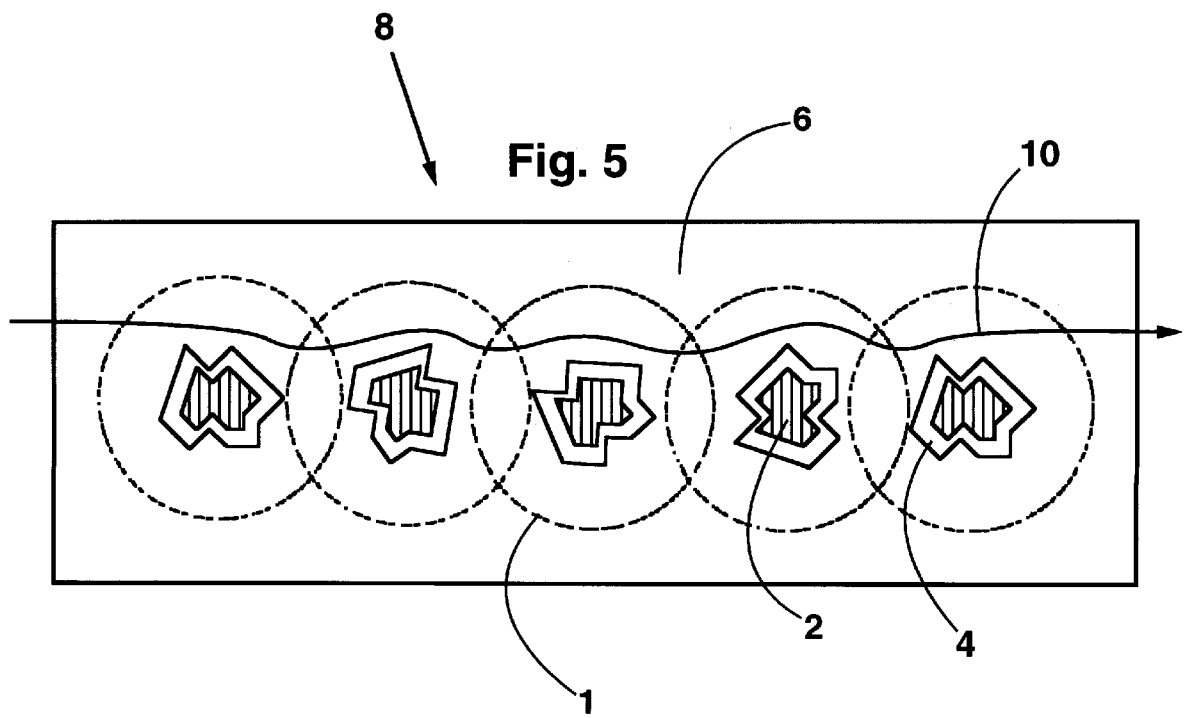
FIG. 5 is a cross sectional view of a row of intrinsic superconducting particles in a metal matrix illustrating how a supercurrent can travel through the proximity superconducting regions.

The composite material 8 must be designed such that adjacent ceramic particles 2 are coupled by the proximity effect. In other words, the proximity effect from adjacent ceramic particles 2 must overlap. If the ceramic particles 2 are too far apart, the critical current density of the composite material 8 will be reduced. FIG. 5 illustrates how a supercurrent 10 can travel through the composite material 8 by staying within the regions induced superconducting by the proximity effect. The circles 1 illustrate the approximate range of the proximity effect. The maximum distance between adjacent ceramic particles 2 will depend upon the temperature the composite material 8 is used, the properties of the metal matrix material 6 and noble material, and the thickness of the noble material coating 4.

A method for making the composite ceramic superconducting material begins with selecting a suitable ceramic superconductor. Several possible ceramic superconductors are shown in Table 3. $YBa_2Cu_3O_7$ is preferred for many applications because of its high flux pinning strength and high $T_c$. A high flux pinning strength allows the material to conduct supercurrent in high magnetic fields without energy loss.

TABLE 3

| Ceramic Superconductor | Critical Temperature, $T_c$ |
|---|---|
| $YBa_2Cu_3O_7$ | 95K |
| $Bi_2Sr_2Ca_2Cu_3O_{10}$ | 105K |
| $Bi_2Sr_2Ca_1Cu_2O_8$ | 85K |
| $(BiPb)_2Sr_2Ca_2Cu_3O_{10}$ | 110K |
| $Tl_2Ba_2Ca_2Cu_3O_{10}$ | 125K |
| $Tl_2Ba_2Ca_1Cu_2O_8$ | 105K |

The superconducting ceramic is first formed into a powder which can be accomplished by many techniques known in the art such as grinding. The ceramic particles of the powder are in the size range of 0.5 to 1.0 microns. The best size range will depend upon the temperature at which the material is used, and the $\lambda$ and decay length of the metal matrix material.

The ceramic particles are then cleaned by plasma etching. Cleaning prepares the surface of the ceramic particles to bond to the noble material coating. Plasma etching techniques for the high $T_c$ ceramics are well known in the art.

The ceramic particles are then coated with a uniform coating of a noble material, preferably silver. Silver is preferred because it is easily applied as a coating, it is permeable to oxygen, and is the least expensive of the metals that are not oxidized by the high $T_c$ ceramics. Silver can be deposited using a number of techniques well known in the art such as chemical deposition and vapor deposition.

A chemically deposited silver coating is formed by stirring the ceramic particles in an nonaqueous solution of a silver salt and adding a reducing agent. The silver is reduced and it precipitates on the surfaces of the ceramic particles. The silver solution must be nonaqueous because water will adversely affect the ceramic particles. A vapor deposited coating is formed by sifting the ceramic particles in a vacuum chamber containing a partial pressure of silver vapor. Both methods form clean silver coatings of accurate thickness. The coating is preferably 5 nm in thickness and completely surrounds each ceramic particle. The silver coating is thick enough to chemically insulate the interior ceramic.

After the ceramic particles are coated with silver, the interior ceramic must be replenished with oxygen. Replenishment is performed by heating the coated particles in an atmosphere with a partial pressure of oxygen. Since silver is permeable to oxygen at elevated temperatures (300° C. and up), oxygen reaches the ceramic. The best temperature, oxygen pressure, and annealing time is specific to each high $T_c$ ceramic and is selected to optimize the superconducting properties of each ceramic. Such annealing techniques for silver coated high $T_c$ ceramics are well known in the art The coated ceramic powder is then intimately mixed with a powder of the metal matrix material. The metal matrix material is selected to be ductile and to be particularly susceptible to the superconducting proximity effect. Preferably, the metal matrix material powder has particle sizes of 0.5 to 1.0 microns. Also preferably, the metal matrix material is a NbTi alloy. The powders are mixed in a ratio of approximately 90% by volume coated ceramic particles and 10% by volume NbTi. This ratio may be adjusted to optimize the superconducting properties of the composite material. The decay lengths and electron-phonon couplings are given for several possible matrix material candidates in Table 4.

TABLE 4

| Metal | e-Phonon Coupling, λ | Decay Length at 77K |
|---|---|---|
| NbTi | 0.92 | 22 nanometers |
| Indium | 0.81 | 28 nanometers |
| Niobium | 1.22 | 22 nanometers |
| Lead | 1.55 | 29 nanometers |
| Tin | 0.72 | 30 nanometers |
| Lead/Bismuth Alloys | 2–3 | 25–28 nanometers |

The mixture is then compressed to fuse the powder mixture into a solid material. Applicable powder-fusing techniques are well known in the art. Since the metal matrix material is ductile, it will flow under pressure to fill the regions between the coated high $T_c$ ceramic particles. Preferably, no voids remain after the powder mixture is fused. Many different useful shapes can be created by disposing the powders into a mold and compressing the mold. The powder mixture can be formed into a wire by placing it into a copper or silver tube and repeatedly drawing the tube to ever smaller diameters.

Alternatively, the silver coated high $T_c$ ceramic particles may be coated with a layer of the metal matrix material instead of being mixed with a powder of the metal matrix material. This matrix material coating can be formed with chemical or physical coating techniques similar to the techniques used to apply the silver coating. Such techniques are well known in the art.

High $T_c$ ceramic particles having a two layer silver and metal matrix material coating can be fused using the same techniques described above.

An alternative embodiment of this invention uses particles of an A15 compound disposed in a metal matrix material. The A15 materials have coherence lengths of approximately 0.1 micron and so the particles should be at least this size. In this embodiment, the A15 particles are not coated with a noble material because the A15 compounds are not chemically reactive with the candidate metal matrix materials. Of course, the metal matrix material is selected to be particularly susceptible to the proximity effect. Preferably, the A15 particles are in the size range of 0.5 to 1.0 microns.

To make this material, powders of the A15 compound and the metal matrix material are mixed in a ratio of approximately 90% by volume A15 and 10% by volume metal matrix material. The ratios of the two powders may be adjusted to optimize the superconducting properties of the composite material. Preferably, the metal matrix material is a NbTi alloy. Since the $T_c$ of many A15 compounds is higher than the $T_c$ of NbTi (10 K), the surrounding NbTi is induced superconducting via the proximity effect. Thus, the composite material inherits the higher $T_c$ of the A15 compound. The $T_c$s of a number of A15 compounds are given in Table 5. The ductile NbTi matrix improves the mechanical properties of the composite material as compared to pure A15 compounds.

TABLE 5

| A15 compound | Critical Temperature, $T_c$ |
|---|---|
| $Nb_3Sn$ | 18.0K |
| $Nb_3Ge$ | 23.2K |
| $Nb_3Al$ | 18.8K |
| $Nb_3Si$ | 19.0K |

Alternatively, the particles of the A15 compound may be coated with a layer of the metal matrix material instead of being mixed with a powder of the metal matrix material. This matrix material coating can be formed with chemical or physical coating techniques similar to the techniques used to apply the silver coating to the high $T_c$ ceramic particles. Such techniques are well known in the art It will be clear to one skilled in the art that the above embodiment may be altered in many ways without departing from the scope of the invention. For example, lead, tin, indium or niobium may be used as the metal matrix material in either the high $T_c$ ceramic or A15 compound embodiment. Accordingly, the scope of the invention should be determined by the following claims and their legal equivalents.

What is claimed is:

1. A composite superconducting material comprising:
   a) a plurality of ceramic particles composed of ceramic superconductor material, wherein the ceramic particles are spatially separated from one another, and wherein the ceramic particles have dimensions larger than a coherence length of the ceramic superconductor material;
   b) a noble material coating the ceramic particles, wherein the noble material is chemically nonreactive with the ceramic particles, and wherein the noble material is electrically conductive; and
   c) a metal matrix material filling regions between and proximate to the coated ceramic particles, wherein the metal matrix material has an electron-phonon coupling coefficient greater than 0.72, wherein the metal matrix material is chemically different from the noble material, and wherein the noble material coating is sufficiently thick to prevent chemical reactions between the ceramic particles and the metal matrix material.

2. The composite superconducting material of claim 1 wherein the ceramic particles have physical dimensions in the range of 1.5 nanometers to 10 microns.

3. The composite superconducting material of claim 1 wherein the noble material coating has a thickness in the range of 5 to 3000 nanometers.

4. The composite superconducting material of claim 1 wherein a thickness of the noble material coating is less than a superconducting decay length of the noble material at 77 Kelvin.

5. The composite superconducting material of claim 1 wherein the noble material is selected from the group consisting of silver, gold, palladium, and alloys thereof.

6. The composite superconducting material of claim 1 wherein the noble material is silver.

7. The composite superconducting material of claim 1 wherein the metal matrix material is selected from the group consisting of niobium, indium, NbTi alloy, tin, lead, lead/bismuth alloys, and alloys thereof.

8. The composite superconducting material of claim 1 wherein the ceramic particles are composed of a material selected from the group consisting of $YBa_2Cu_3O_7$, $Bi_2Sr_2Ca_2Cu_3O_{10}$, $Bi_2Sr_2Ca_1Cu_2O_8$, $(BiPb)_2Sr_2Ca_2Cu_3O_{10}$, $Tl_2Ba_2Ca_2Cu_3O_{10}$, and $Tl_2Ba_2Ca_1Cu_2O_8$.

9. The composite superconducting material of claim 1 wherein the metal matrix material is more ductile than the ceramic particles.

10. The composite superconducting material of claim 1 wherein the metal matrix material has an electron-phonon coupling coefficient greater than 1.0.

11. The composite superconducting material of claim 1 wherein the ceramic particles and noble material comprise about 90% by volume of the composite material, and the metal matrix material comprises about 10% by volume of the composite material.

12. A composite superconducting material comprising:
a) a plurality of A15 compound particles made of A15 compound material, wherein the A15 compound particles have physical dimensions larger than a superconducting coherence length of the A15 compound material; and
b) a metal matrix material filling regions between and proximate to said A15 compound particles, wherein the metal matrix material has an electron-phonon coupling coefficient greater than 0.72, and wherein the metal matrix material is chemically different from the A15 compound particles.

13. The composite superconducting material of claim 12 wherein the A15 compound particles have physical dimensions in the range of 0.1 microns to 10 microns.

14. The composite superconducting material of claim 12 wherein the A15 compound particles are made of a material selected from the group consisting of $Nb_3Sn$, $Nb_3Ge$, and $Nb_3Al$.

15. The composite superconducting material of claim 12 wherein the metal matrix material is selected from the group consisting of niobium, indium, NbTi alloy, tin, lead, lead/bismuth alloys, and alloys thereof.

16. The composite superconducting material of claim 12 wherein the metal matrix material has an electron-phonon coupling coefficient greater than 1.0.

17. The composite superconducting material of claim 12 wherein the metal matrix material is more ductile than the A15 compound particles.

18. The composite superconducting material of claim 12 wherein the A15 compound particles comprise about 90% by volume of the composite material, and the metal matrix material comprises about 10% by volume of the composite material.

19. A method for producing a composite superconducting material comprising the steps of:
a) forming a plurality of ceramic particles, wherein the ceramic particles are composed of ceramic superconductor material, wherein the ceramic particles have dimensions larger than a coherence length of the ceramic superconductor material;
b) coating each ceramic particle with a noble material to form coated ceramic particles, wherein the noble material is chemically nonreactive with the ceramic particles;
c) forming a plurality of particles of a metal matrix material, wherein the metal matrix material has an electron-phonon coupling coefficient greater than 0.72; and wherein the noble material coating is sufficiently thick to prevent chemical reactions between the ceramic particles and the metal matrix material
d) mixing the coated ceramic particles and the particles of metal matrix material to form a mixture; and
e) fusing the mixture to form a solid material.

20. A method for producing a composite superconducting material comprising the steps of:
a) forming a plurality of ceramic particles, wherein the ceramic particles are composed of ceramic superconductor material, wherein the ceramic particles have dimensions larger than a coherence length of the ceramic superconductor material;
b) coating each ceramic particle with a noble material to form coated ceramic particles, wherein the noble material is chemically nonreactive with the ceramic particles;
c) covering the coated ceramic particles with a coating of metal matrix material to form doubly coated ceramic particles, wherein the metal matrix material has an electron-phonon coupling coefficient greater than 0.72; and wherein the noble material coating is sufficiently thick to prevent chemical reactions between the ceramic particles and the metal matrix material
d) fusing the doubly coated ceramic particles to form a solid material.

21. A method for producing a composite superconducting material comprising the steps of:
a) forming a plurality of A15 compound particles made of A15 compound material, wherein the A15 compound particles have physical dimensions larger than a superconducting coherence length of the A15 compound material;
b) forming a plurality of particles of a metal matrix material, wherein the metal matrix material has an electron-phonon coupling coefficient greater than 0.72;
c) mixing the A15 compound particles and the particles of metal matrix material to form a mixture; and
d) fusing the mixture to form a solid material.

22. A method for producing a composite superconducting material comprising the steps of:
a) forming a plurality of A15 compound particles made of A15 compound material, wherein the A15 compound particles have physical dimensions larger than a superconducting coherence length of the A15 compound material;
b) coating each A15 compound particle with a coating of metal matrix material to form coated A15 compound particles, wherein the metal matrix material has an electron-phonon coupling coefficient greater than 0.72; and
c) fusing the coated A15 compound particles to form a solid material.

* * * * *